(12) United States Patent
Feshali et al.

(10) Patent No.: US 8,866,247 B2
(45) Date of Patent: Oct. 21, 2014

(54) PHOTONIC DEVICE WITH A CONDUCTIVE SHUNT LAYER

(75) Inventors: Avi Feshali, Los Angeles, CA (US); Tao Sherry Yin, San Jose, CA (US); Ansheng Liu, Cupertino, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 13/977,390

(22) PCT Filed: Mar. 29, 2012

(86) PCT No.: PCT/US2012/031302
§ 371 (c)(1),
(2), (4) Date: Jun. 28, 2013

(87) PCT Pub. No.: WO2013/147813
PCT Pub. Date: Oct. 3, 2013

(65) Prior Publication Data
US 2014/0008750 A1 Jan. 9, 2014

(51) Int. Cl.
*H01L 31/0232* (2014.01)
*H01L 21/00* (2006.01)
*H01L 31/102* (2006.01)
*H01L 31/10* (2006.01)
*H01L 31/18* (2006.01)

(52) U.S. Cl.
CPC ............ *H01L 31/0232* (2013.01); *H01L 31/10* (2013.01); *H01L 31/18* (2013.01)
USPC .................. 257/432; 257/E31.127; 257/436; 257/458; 438/72

(58) Field of Classification Search
USPC .................. 257/32, E31.127, 436, 458, 432; 438/72; 136/246, 256, 251, 255, 249, 136/258–262
See application file for complete search history.

(56) References Cited

U.S. PATENT DOCUMENTS 4,590,327 A * 5/1986 Nath et al. ..................... 136/256
5,268,039 A * 12/1993 Vogeli et al. .................. 136/256
(Continued)

FOREIGN PATENT DOCUMENTS

WO 2011120089 A1 10/2011

OTHER PUBLICATIONS

International Search Report and Written Opinion for PCT/US2012/031302, mailed Nov. 23, 2012, 7 pages.

*Primary Examiner* — Evan Pert
*Assistant Examiner* — Gustavo Ramallo
(74) *Attorney, Agent, or Firm* — Schwabe Williamson & Wyatt PC

(57) ABSTRACT

Described are embodiments of apparatuses and systems including photonic devices having a conductive shunt layer, and methods for making such apparatuses and systems. A photonic device may include a device substrate, a photo-active region disposed on a first region of the device substrate, an isolation region in the device substrate, a contact disposed on a second region of the substrate such that the isolation region is located between the contact and the photo-active region, and a conductive material overlying the isolation region to shunt the first region with the second region. Other embodiments may be described and/or claimed.

25 Claims, 12 Drawing Sheets

(56) References Cited

U.S. PATENT DOCUMENTS

| | | | | |
|---|---|---|---|---|
| 5,747,860 | A * | 5/1998 | Sugiyama et al. | 257/432 |
| 6,468,828 | B1 * | 10/2002 | Glatfelter et al. | 438/80 |
| 7,109,050 | B2 * | 9/2006 | Maruyama | 438/29 |
| 7,142,761 | B2 * | 11/2006 | Liu et al. | 385/131 |
| 2006/0042684 | A1 * | 3/2006 | Sharps et al. | 136/255 |
| 2009/0283137 | A1 * | 11/2009 | Croft et al. | 136/251 |
| 2011/0017271 | A1 * | 1/2011 | Tsai et al. | 136/246 |
| 2012/0006385 | A1 * | 1/2012 | Hassan et al. | 136/246 |
| 2014/0008750 | A1 * | 1/2014 | Feshali et al. | 257/432 |

* cited by examiner

PHOTONIC DEVICE WITH A CONDUCTIVE SHUNT LAYER

CROSS REFERENCE TO RELATED APPLICATION

The present application is a national phase entry under 35 U.S.C. §371 of International Application No. PCT/US2012/031302, filed Mar. 29, 2012, entitled "PHOTONIC DEVICE WITH A CONDUCTIVE SHUNT LAYER," which designates, among the various States, the United States of America, and the entire contents and disclosures of which are hereby incorporated by reference in their entireties.

TECHNICAL FIELD

Embodiments of the present disclosure relate generally to photonic devices and, more particularly, to photonic devices including a photodetector and a conductive shunt layer.

BACKGROUND

Silicon photonic circuits generally route optical signals in planar waveguides. Routing light in or out of the wafer surface can be valuable for several reasons, such as coupling into a normal-incidence photodetector on the wafer surface, for wafer-level optical test and characterization, or other potential applications.

BRIEF DESCRIPTION OF THE DRAWINGS

Embodiments of the present disclosure will be described by way of example embodiments, but not limitations, illustrated in the accompanying drawings in which like references denote similar elements, and in which.

all in accordance with embodiments of the present disclosure.

DETAILED DESCRIPTION

Described herein are photonic devices and, more particularly, to photonic devices including a photodetector and a conductive shunt layer, systems including such photonic devices, and methods for fabricating such photonic devices.

In the following description, various aspects of the illustrative implementations will be described using terms commonly employed by those skilled in the art to convey the substance of their work to others skilled in the art. It will be apparent to those skilled in the art, however, that embodiments of the present invention may be practiced with only some of the described aspects. For purposes of explanation, specific numbers, materials and configurations are set forth in order to provide a thorough understanding of the illustrative implementations. It will be apparent to one skilled in the art, however, that the present invention may be practiced without the specific details. In other instances, well-known features arc omitted or simplified in order not to obscure the illustrative implementations.

Various aspects of the illustrative embodiments will be described using terms commonly employed by those skilled in the art to convey the substance of their work to others skilled in the art. However, it will be apparent to those skilled in the art that alternate embodiments may be practiced with only some of the described aspects. For purposes of explanation, specific numbers, materials, and configurations are set forth in order to provide a thorough understanding of the illustrative embodiments. However, it will be apparent to one skilled in the art that alternate embodiments may be practiced without the specific details. In other instances, well-known features are omitted or simplified in order not to obscure the illustrative embodiments.

Further, various operations will be described as multiple discrete operations, in turn, in a manner that is most helpful in understanding the illustrative embodiments; however, the order of description should not be construed as to imply that these operations are necessarily order dependent. In particular, these operations need not be performed in the order of presentation. Moreover, methods within the scope of this disclosure may include more or fewer steps than those described.

The phrase "in some embodiments" is used repeatedly. The phrase generally does not refer to the same embodiments; however, it may. The terms "comprising," "having," and "including" are synonymous, unless the context dictates otherwise. The phrase "A and/or B" means (A), (B), or (A and B). The phrase "A/B" means (A), (B), or (A and B), similar to the phrase "A and/or B". The phrase "at least one of A, B and C" means (A), (B), (C), (A and B), (A and C), (B and C) or (A, B and C). The phrase "(A) B" means (B) or (A and B), that is, A is optional.

Figure 1:
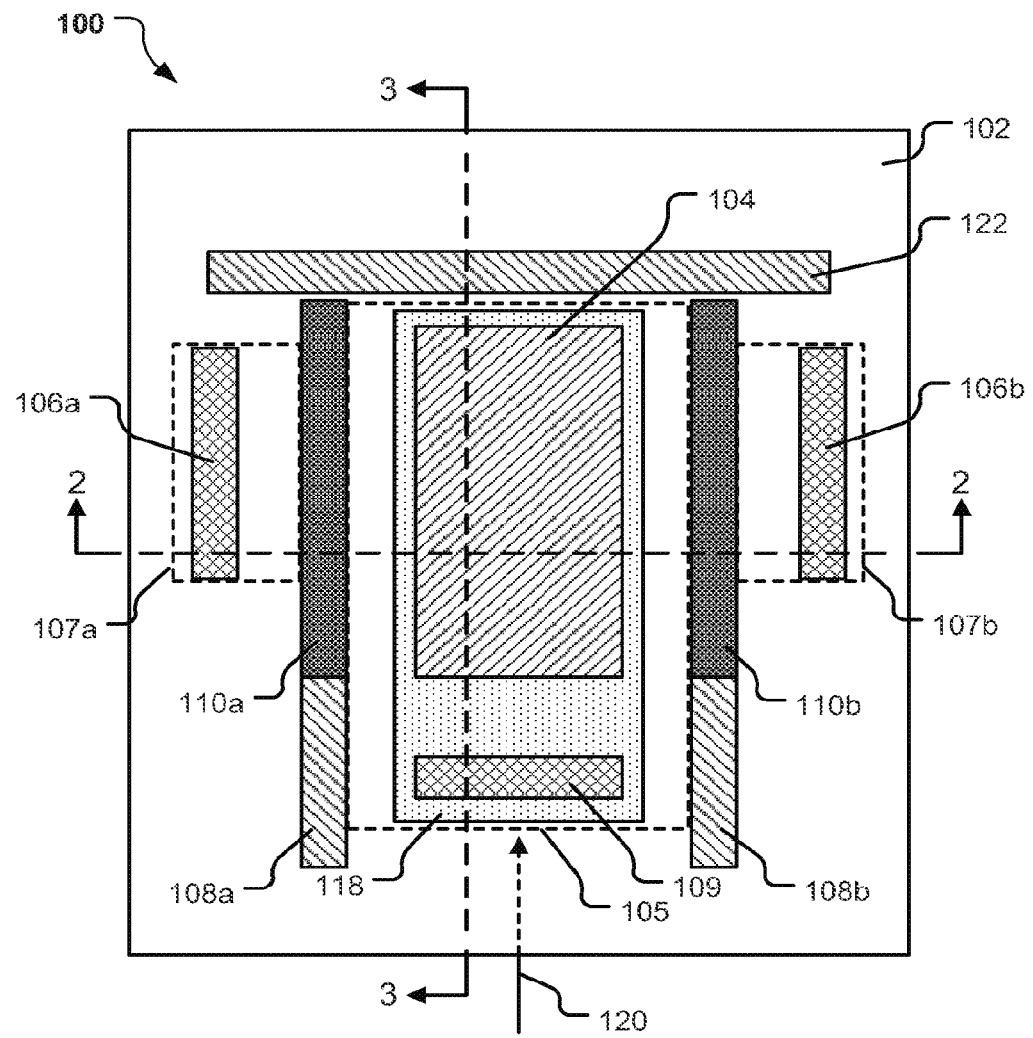
FIG. 1 illustrates an example photonic device having a conductive shunt layer.
Figure 2:
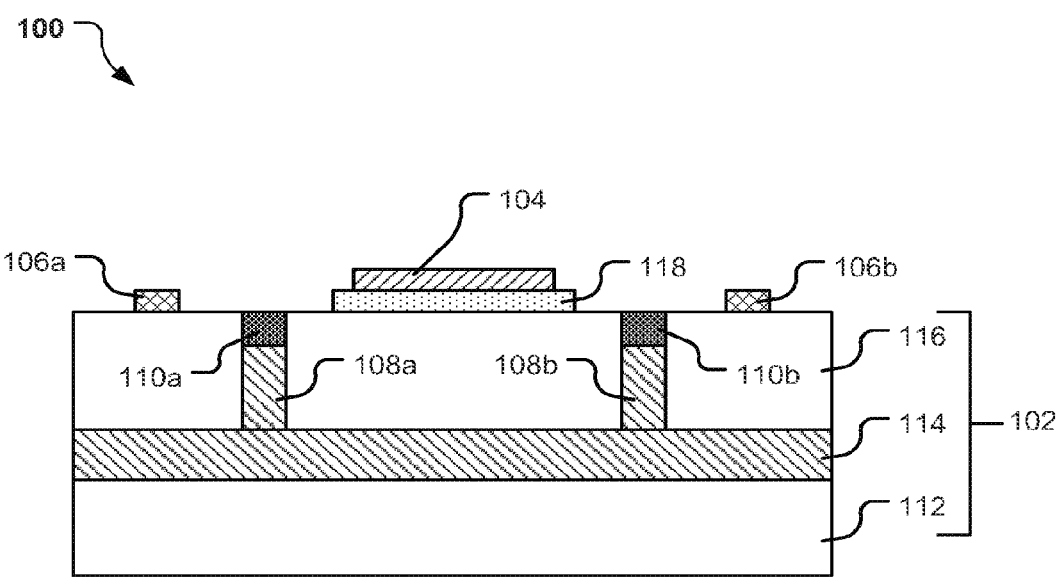
FIG. 2 illustrates a cross-sectional side view of the device of FIG. 1 taken along line 2-2.

FIG. 1 shows a photonic device 100 having a device substrate 102, and FIG. 2 shows a cross-sectional view. As depicted, the photonic device 100 includes a photo-active region 104 disposed on a first region 105 of the device substrate 102. The photonic device 100 may include at least one side contact 106a, 106b disposed on a second region 107a, 107b of the device substrate 102. The circuit 100 may include at least one isolation region 108a, 108b for forming a waveguide structure. The device substrate 102 may include at least one shunt 110a, 110b.

As used herein, the term "first region" may refer to the side of the isolation region 108a or 108b at which the photo-active region 104 is disposed. In various embodiments, the first region may encompass generally the area bounded by the hashed line denoted by 105. The term "second region" may refer to the opposite side of the isolation region 108a or 108b. For embodiments including two isolation regions 108a and 108b, the "first region" may refer to the area between isolation region 108a and isolation region 108b, while the "second region" may refer to the area outside the area bounded by isolation region 108a and isolation region 108b. In various embodiments, the first region may encompass generally the area(s) bounded by the hashed lines denoted by 107a and/or 107b.

The at least one shunt 110a, 110b may provide conductivity in a horizontal direction between the photo-active region 104 and the at least one side contact 106a, 106b. In various embodiments, the substrate 102 is formed of a conductive or semi-conductive material, and the at least one isolation region 108a, 108b electrically isolates at least part of the first region 105 of the substrate 102 from the second region 107a, 107b of the substrate 102. The at least one shunt 110a, 110b may effectively provide a bridging effect by overlying the at least one isolation region 108a, 108b so that at least a portion of the first region 105 of the substrate 102 is electrically coupled with the second region 107a, 107b of the substrate 102.

By providing conductivity in the horizontal direction, side contacts 106a, 106b can be formed on the substrate 102 in addition to or instead of a contact 109 located within the first region 105. This horizontal conductivity may result in the bandwidth of the photonic device 100 being increased relative to conventional arrangements. In various embodiments, this increased bandwidth may result, at least in part, to a reduction in resistance corresponding to an increase in the number of contacts on the substrate 102. For example, in various embodiments, a photonic device may include one side contact 106a or 106b in addition to the contact 109, or two side contacts 106a and 106b in addition to or instead of the contact 109.

The shunt 110a, 110b may comprise a material suitable for electrically shunting the first region 105 of the substrate 102 with the second region 107a, 107b of the substrate 102. In various embodiments, the shunt 110a, 110b comprises a conductive material. For example, in various embodiments, the shunt 110a, 110b may comprise doped poly-silicon. In other embodiments, the shunt 110a, 110b may comprise a metal or other conductive material.

The device substrate 102 may comprise any suitable material or materials for forming a photonic device. In various embodiments, the device substrate 102 may comprise a semiconductor substrate. For example, the device substrate 102 may comprise a silicon-on-insulator substrate comprising a handle substrate 112, a buried insulating layer 114 on the handle substrate 112, and a silicon layer 116 on the buried insulating layer 114. The buried insulating 114 may comprise oxide. In various embodiments, the buried insulating 114 may comprise sapphire or another suitable insulating material. The handle substrate 112 may comprise silicon, such as, for example, doped silicon. In various embodiments, the handle substrate 112 is heavily boron-doped at about $10^{20}$ cm$^{-3}$ by implantation, which may make the handle substrate 112 resistant to etching. The silicon layer 116 may comprise a device fabrication wafer or epitaxial silicon. In various embodiments, the silicon layer 116 may comprise <100> silicon.

In other implementations, the semiconductor substrate may be formed using alternate materials, which may or may not be combined with silicon, that include but are not limited to germanium, indium antimonide, lead telluride, indium arsenide, indium phosphide, gallium arsenide, or gallium antimonide. Further materials classified as group III-V or group IV materials may also be used to form the substrate. Although a few examples of materials from which the substrate may be formed are described here, any material that may serve as a foundation upon which a semiconductor device may be built falls within the spirit and scope of the present invention.

The photo-active region 104 may comprise any suitable photodetector for forming the photonic device 100. In various embodiments, the photo-active region 104 comprises a germanium-based photodetector comprising germanium or silicon germanium. The photo-active region 104 may be disposed on an intermediate conductive material 118, which may in turn be disposed on the device substrate 102. The intermediate conductive material 118 may provide a conductive coupling between the photo-active region 104 and the device substrate 102. In various embodiments, the intermediate conductive material 118 may comprise a doped material such as, for example, doped silicon. In various other embodiments, the intermediate conductive material 118 may comprise a metal or a semi-conductive material.

The device substrate 102 may form, at least in part, a planar waveguide in which light 120 may be input into the silicon layer 116 for absorption by the photo-active region 104. In embodiments in which the device substrate 102 comprises a silicon-on-insulator substrate, light 120 may be confined in the buried insulating layer 114 by total internal reflection. Alternatively, in various embodiments, light may be coupled with the waveguide from above the device substrate 102 and photo-active region 104.

In various embodiments, the circuit 100 may include a mirror 122 configured to reflect the light 120 from the waveguide so that optical signals can be coupled more efficiently to the surface of the device substrate 102. The mirror 122 may include an angled facet 124a configured to reflect the light 120 toward the photo-active region 104. In various embodiments, the angled facet 124a of the mirror 122 may be configured to reflect the light 120 into a direction normal to the surface of the device substrate 102 and toward the photo-active region 104. To that end, the angled facet 124a of the mirror 122 may be configured with a 54.7° angle to a direction normal to the surface of the device substrate 102. In other embodiments, the angled facet 124a of the mirror 122 may be configured with a 45° angle to a direction normal to the surface of the device substrate 102. In still further embodiments, the angled facet 124a of the mirror 122 may be configured with an angle in the range of 30° to 54.7° to a direction normal to the surface of the device substrate 102. In various embodiments, the angled facet 124a may lie in a re-entrant <111> crystal plane orientation of the silicon layer 116 of the device substrate 102.

Figure 3:
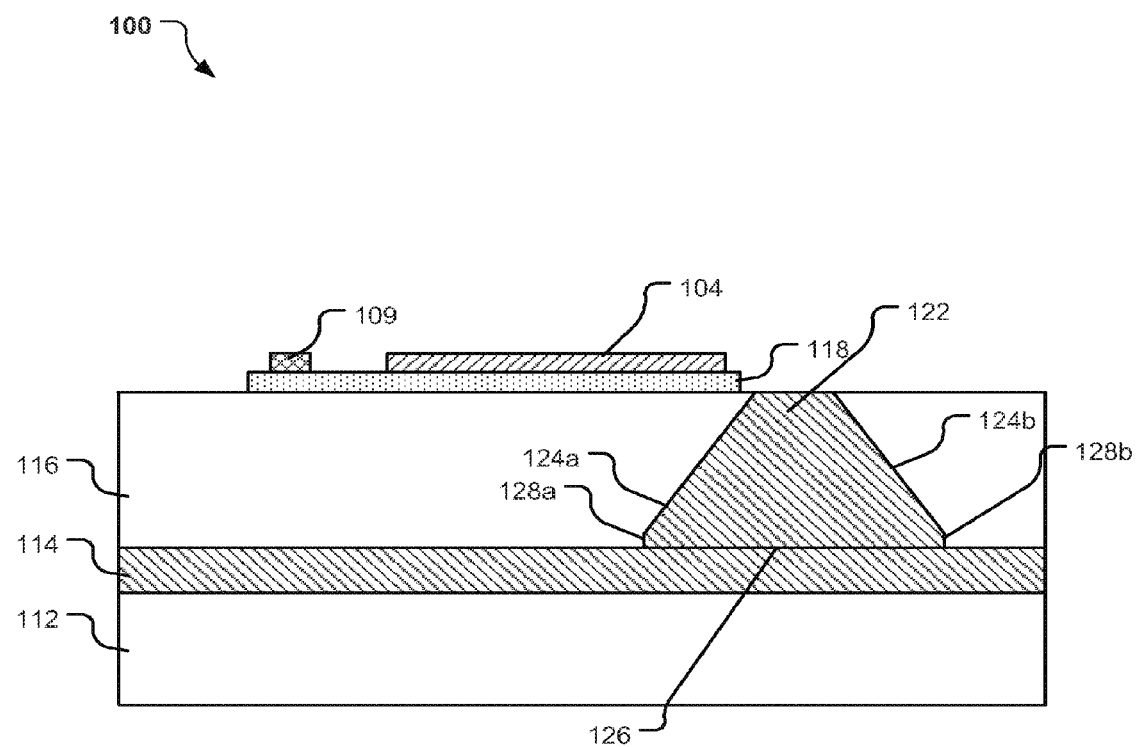
FIG. 3 illustrates another cross-sectional side view of the device of FIG. 1 taken along line 3-3.

As shown in FIG. 3, the mirror 122 may comprise a trapezoid-shaped area having a bottom side 126 defined by the handle substrate 112, opposite vertical sides 128a, 128b defined by the insulating layer 114, and inwardly angled facets 124a, 124b defined by the silicon layer 116. In various embodiments, the trapezoid-shaped area may be filled with an insulating material such as, for example, oxide. In various other embodiments, the trapezoid-shaped area may be filled with a polymer.

In various embodiments, the light 120 may travel in the insulating layer 114, confined by one or more isolation regions 108a, 108b for more efficient optical coupling with the photo-active region 104. As shown, for example, the waveguide may be direct light 120 to the photodetector 104 in which the light 120 is confined by two isolation regions 108a, 108b. As also shown, the isolation regions 108a, 108b may comprise a first isolation region 108a located on a first side of the photo-active region 104 and a second isolation region 108b located on a second side of the photo-active region 104 such that the photo-active region 104 is located between the first isolation region 108a and the second isolation region 108b.

The isolation regions 108a, 108b may each comprise a trench filled, at least in part, with an insulating material. In various embodiments, the isolation regions 108a, 108b may be filled, at least in part, with a material with a refractive index that is smaller than that of silicon, such as, for example, silicon oxide. In various other embodiments, the isolation regions 108a, 108b may be filled, at least in part, for example, with silicon nitride or may be left unfilled altogether (i.e., filled with air). In various embodiments, the material of the shunt 110a, 110b may be disposed, at least in part, within the trench as shown in FIG. 2.

Figure 4:
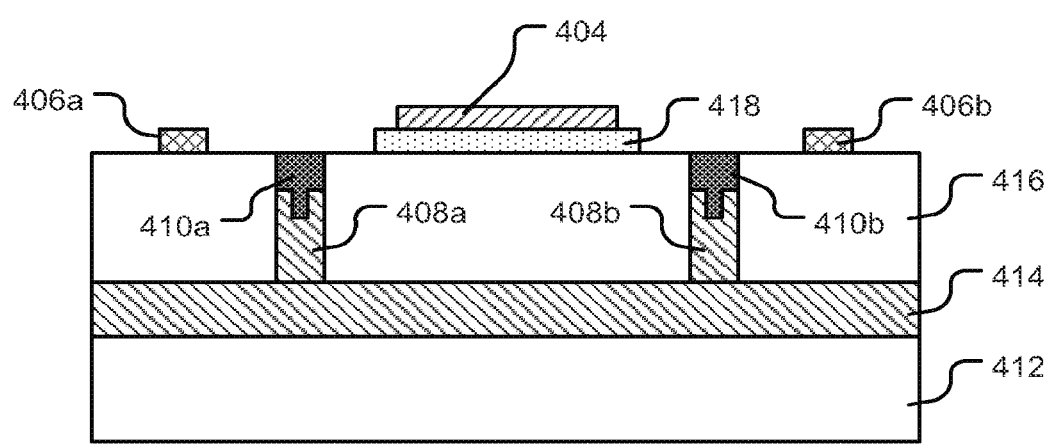
FIG. 4 illustrates another example photonic device having a conductive shunt layer.

FIG. 4 shows another example of a photonic device 400 in which the material of the shunt 410a, 410b includes a center portion that extends deeper into the isolation regions 408a, 408b. In various embodiments, this profile may result depending on the type of processing operation(s) used for filling the trenches with the insulating material for forming the isolation regions 408a, 408b. For example, during a chemical vapor deposition of insulating material deep into the trenches, the bottom and sidewalls of the trenches may tend to accumulate the insulating material faster, which leads to the center portion extending deeper into the isolation regions 408a, 408b.

The photonic device 400 shown in FIG. 4 may include one or more elements of other embodiments described herein. As shown, for example, the photonic device 400 may include a silicon-on-insulator substrate comprising a handle substrate 412, a buried insulating layer 414 on the handle substrate 412, and a silicon layer 416 on the buried insulating layer 414. The photonic device 400 may include a photo-active region 404 disposed on an intermediate conductive material 418. The photonic device 400 may include at least one side contact 406a, 406b.

An example method for forming the photonic device 400 of FIG. 4 is illustrated in FIGS. 5-10 by way of sectional views of the photonic device 400 at various stages of the method. It is noted that it will be clear that various operations of the example method may also be suitable for forming the photonic device 100 of FIGS. 1-3.

Figure 5:
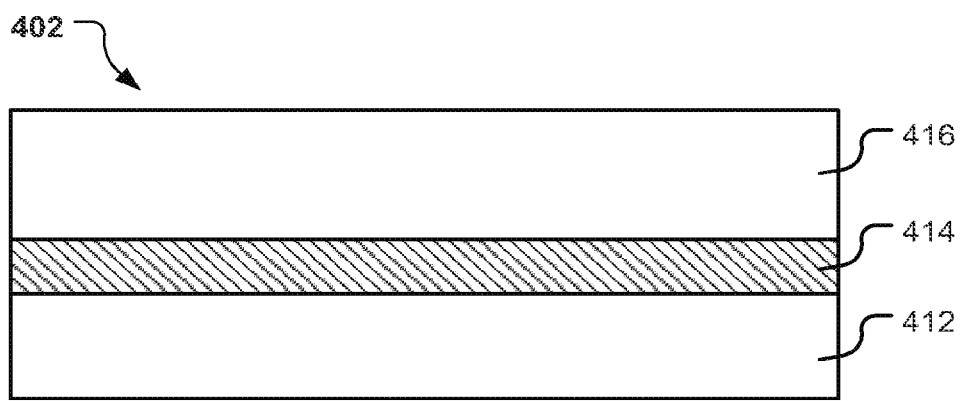
FIGS. 5-10 illustrate various stages of a method for making a photonic device having a conductive shunt layer.

As shown in FIG. 5, a device substrate 402 may be provided. The device substrate 402 may comprise a silicon-on-insulator substrate comprising a handle substrate 412, a buried insulating layer 414 on the handle substrate 412, and a silicon layer 416 on the buried insulating layer 414.

Figure 6:
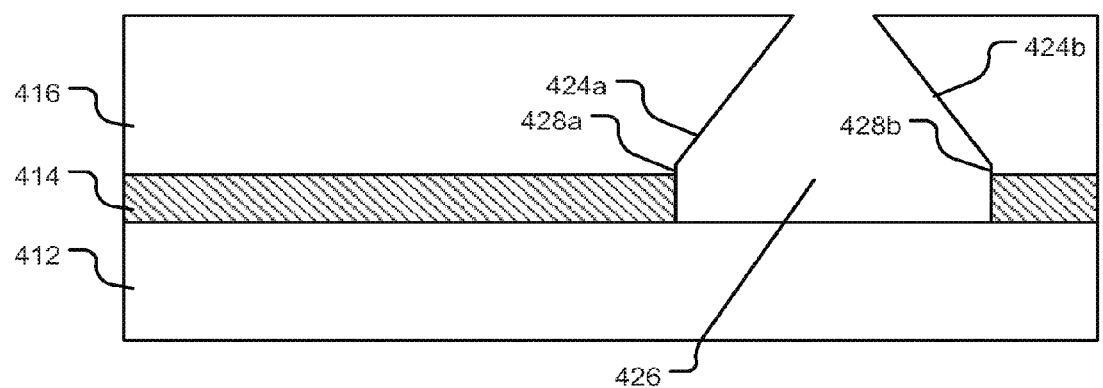

A mirror may be formed as shown in FIG. 6. The mirror may comprise a trapezoid-shaped area having a bottom side 426 defined by the handle substrate 412, opposite vertical sides 428a, 428b defined by the insulating layer 414, and inwardly angled facets 424a, 424b defined by the silicon layer 416. In various embodiments, the trapezoid-shaped area may then be filled with an insulating material (not shown) as described elsewhere.

Figure 7:
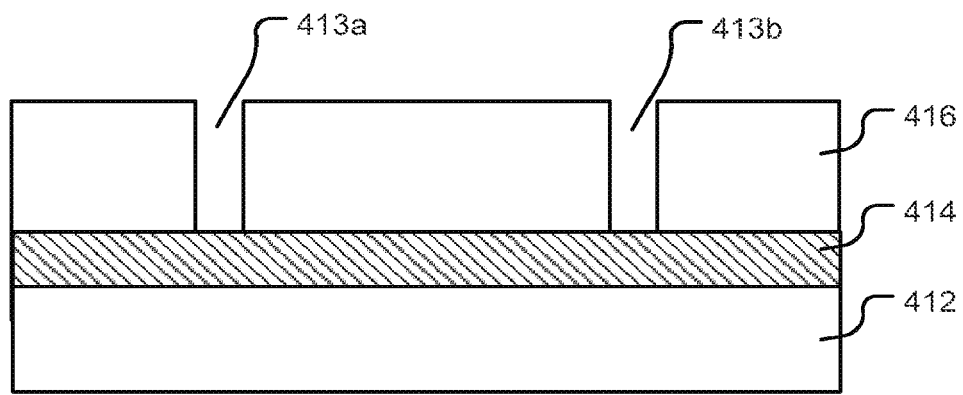

Trenches 413a, 413b may be formed in the silicon layer 416 as shown in FIG. 7. The trenches 413a, 413b may be formed using a suitable etching operation. The etching operation may be a wet etch or a dry etch.

Figure 8:
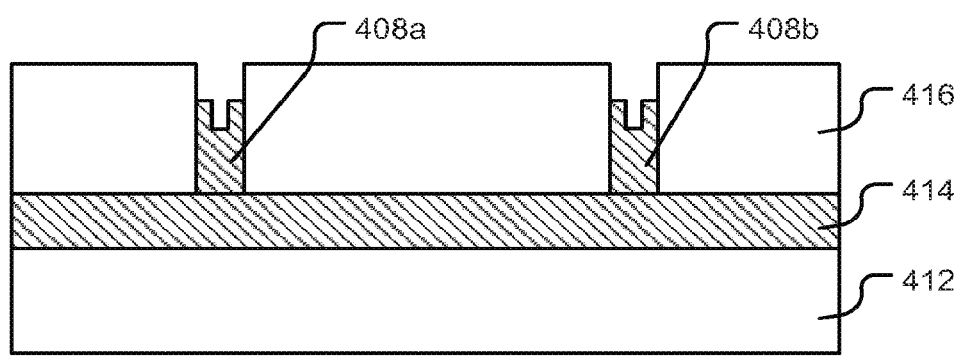

The trenches 413a, 413b may be filled, at least in part, with an insulating material for forming the isolation regions 408a, 408b, as shown in FIG. 8. In various embodiments, rather than only partially filling the trenches 413a, 413b, the trenches 413a, 413b may instead be completely filled or overfilled with the insulating material in which case an etch operation may be performed for etching back the insulating material to allow room for the shunts to be formed subsequently.

Figure 9:
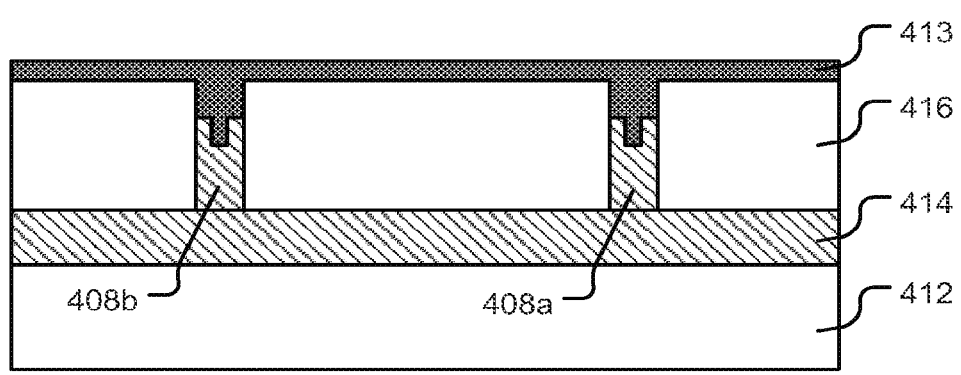
Figure 10:
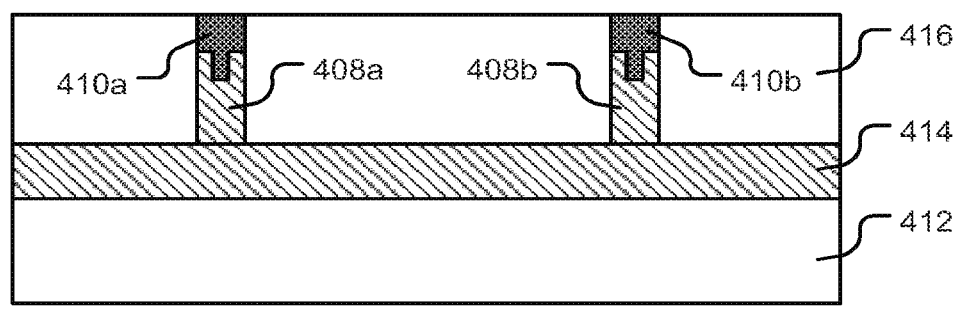

After filling the trenches 413a, 413b with the insulating material for forming the isolation regions 408a, 408b, a conductive material 413 for forming the shunts may be formed over the insulating material of the isolation regions 408a, 408b, as shown in FIG. 9. For embodiments in which the isolation regions 408a, 408b are partially filled with insulating material, the conductive material 413 may be formed, at least in part, within the trenches, overlying the insulating material of the isolation regions 408a, 408b, as shown. In various embodiments, forming the conductive material 413 may overfill the trenches, as shown, in which case an etch operation may be performed for etching back the conductive material 413 to form the structure shown in FIG. 10.

Referring back to FIG. 4, one or more additional operations may be performed for forming various other elements of the photonic device 400 including the photo-active region 404, the intermediate conductive material 418, and the at least one side contact 406a, 406b. Although not shown in FIG. 4, another contact similar to contact 109 described with reference to FIG. 1 may also be formed.

Figure 11:
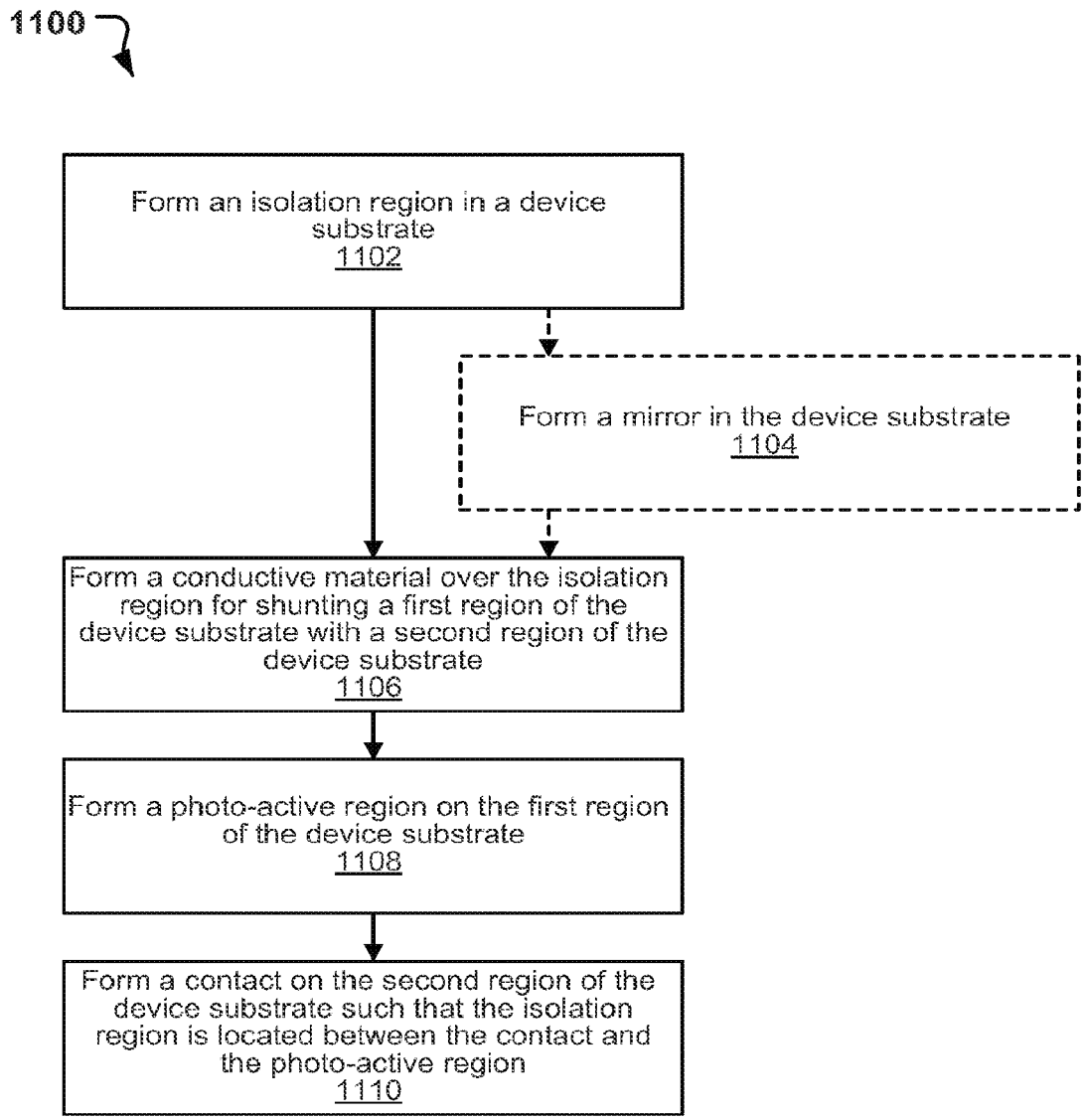
FIG. 11 is a flow diagram of some of the operations associated with a method for fabricating a photonic device having a conductive shunt layer.

FIG. 11 is a flow diagram of some of the operations associated with method 1100 for making an apparatus including a photonic device (100 or 400 described herein, for example) having a conductive shunt layer, in accordance with various embodiments.

Turning now to FIG. 11, a method for making an apparatus including a photonic device may include one or more functions, operations, or actions as is illustrated by block 1102, 1104, 1106, 1108, and/or 1110.

Processing for the method 1100 may start with block 1102 by forming at least one isolation region in a device substrate. In various embodiments, the method may include forming a trench in the device substrate and filling the trench with the insulating material. The device substrate may comprise a silicon-on-insulator structure. The device substrate may form, at least in part, a waveguide, which may be confined by the isolation region.

Processing for the method 1100 may optionally proceed to block 1104 by forming a mirror in the device substrate. As described herein, the mirror may comprise a facet configured to reflect light from the waveguide toward a photo-active region on the device substrate. The mirror may be formed by forming a trapezoid-shaped area in the device substrate. The trapezoid-shaped area may be filled with oxide or a polymer.

Processing for the method 1100 may proceed to block 1106, either from block 1102 or block 1104, by forming a conductive material over the isolation region for shunting a first region of the device substrate with a second region of the device substrate.

Processing for the method 1100 may proceed to block 1108 by forming a photo-active region on the first region of the device substrate. The photo-active region may comprise forming a germanium photodetector on the first region of the device substrate. In various embodiments, the photo-active region may comprise forming a germanium photodetector on an intermediate conductive area on the first region of the device substrate.

Processing for the method 1100 may proceed to block 1110 by forming a contact on the second region of the device substrate such that the isolation region is located between the contact and the photo-active region. In various embodiments, a first contact may be formed on a first side of the second region such that a first isolation region is between the first contact and the photo-active region, and a second contact may be formed on a second side of the second region such that a second isolation region is between the second contact and the photo-active region. In various embodiments, a contact may also be formed on the photo-active region.

Figure 12:
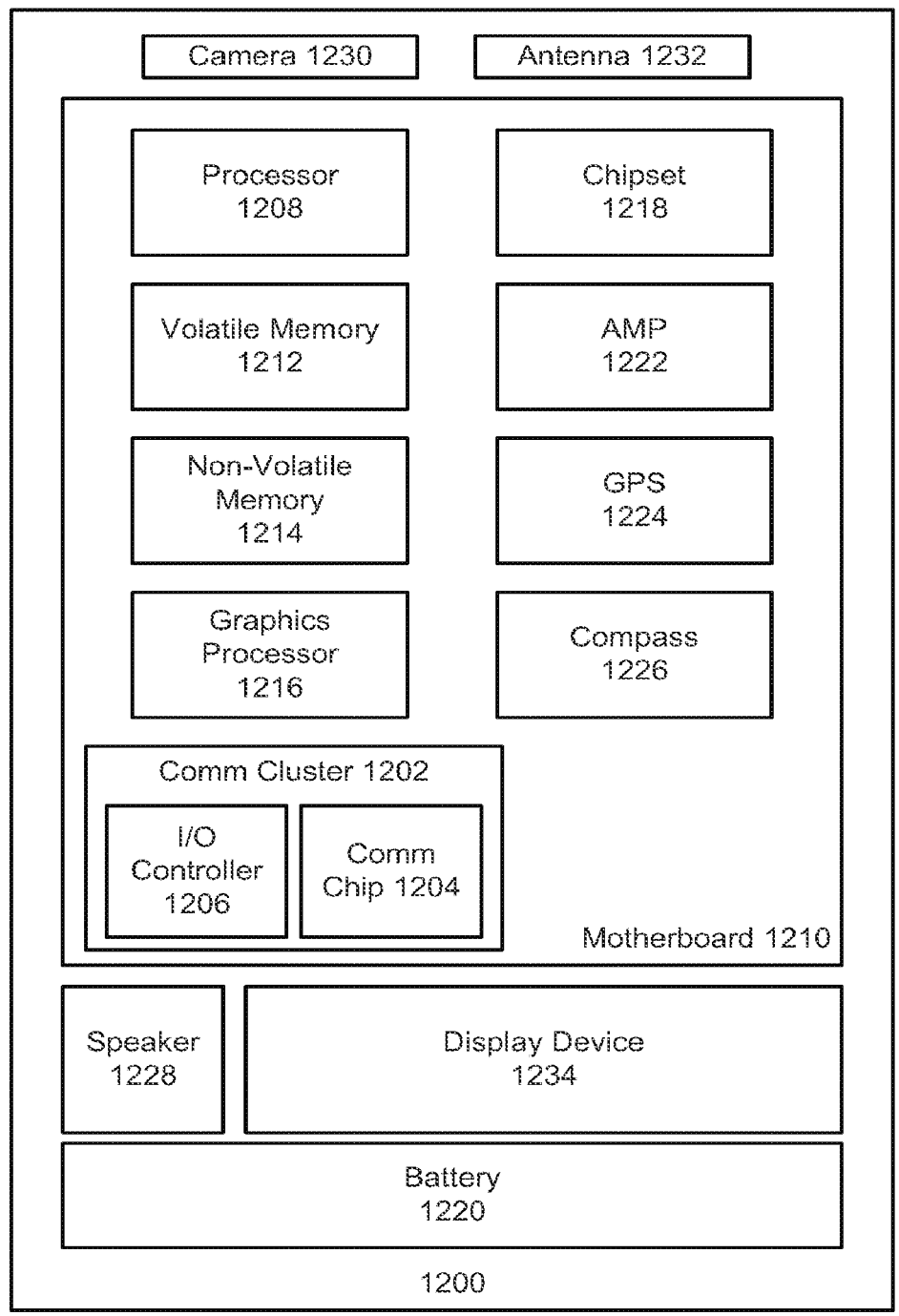
FIG. 12 is a block diagram of an example system incorporating an apparatus including a photonic device having a conductive shunt layer.

Embodiments of apparatuses described herein may be incorporated into various other apparatuses and systems including, but not limited to, various computing and/or consumer electronic devices/appliances. A block diagram of an example system 1200 is illustrated in FIG. 12. The photonic devices described herein may be included in one or more of the elements of the system 1200. In various embodiments, the system 1200 may have more or fewer components, and/or different architectures than that shown in FIG. 12.

In various implementations, the system 1200 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the system 1200 may be any other electronic device that processes data.

The system 1200 may include a communications cluster 1202 operatively to facilitate communication of the system 1200 over one or more networks and/or with any other suitable device. The communications cluster 1202 may include at least one communication chip 1204 and at least one I/O controller 1206. In some implementations, the at least one I/O controller 1206 may be part of the at least one communication chip 1204. In some implementations the at least one communication chip 1204 may be part of the processor 1208.

In various embodiments, the system 1200 may house a motherboard 1210 with which the processor 1208 and/or the communications cluster 1202 may be physically and electrically coupled.

Depending on its applications, the system 1200 may include other components that may or may not be physically and electrically coupled to the mother board. These other components include, but are not limited to, volatile memory 1212 (e.g., DRAM), non-volatile memory 1214 (e.g., ROM), flash memory, a graphics processor 1216, a digital signal processor, a crypto processor, a chipset 1218, a battery 1220, an audio codec, a video codec, a power amplifier 1222, a global positioning system (GPS) device 1224, a compass 1226, an accelerometer, a gyroscope, a speaker 1228, a camera 1230, an antenna 1232, and a mass storage device (such as hard disk drive, compact disk (CD), digital versatile disk (DVD), and so forth).

The communication chip 1204 may enable wireless communications for the transfer of data to and from the system 1200. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1204 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 2G, 3G, 4G, 5G, and beyond. The system 1200 may include a plurality of communication chips 1204. For instance, a first communication chip may be dedicated to shorter range wireless communications such as Wi-Fi and Bluetooth and a second communication chip may be dedicated to longer range wireless communications such as GPS, EDGE, GPRS, CDMA, WiMAX, LTE, Ev-DO, and others.

The system 1200 may include a display device 1234, such as, for example, a cathode ray tube (CRT), liquid crystal display (LCD), light emitting diode (LED), or other suitable display device. The display device 1234 may be a touch screen display supporting touch screen features, and in various one of these embodiments, the I/O controller 1206 may include a touchscreen controller. In various embodiments, the display device 1234 may be a peripheral device interconnected with the system 1200.

The processor 1208 of the system 1200 may include an integrated circuit die packaged within the processor 1208. In some implementations, the integrated circuit die of the processor 1208 may include one or more devices, such as transistors or metal interconnects. The term "processor" may refer to any device or portion of a device that processes electronic data from registers and/or memory to transform that electronic data into other electronic data that may be stored in registers and/or memory. The communication chip 1204 may also include an integrated circuit die packaged within the communication chip 227. The I/O controller 1206 may also include an integrated circuit die packaged within the I/O controller 1206.

The following paragraphs describe various embodiments.

In various embodiments, a photonic device may comprise a device substrate, a photo-active region disposed on a first region of the device substrate, an isolation region in the device substrate, a contact disposed on a second region of the substrate such that the isolation region is located between the contact and the photo-active region, and a conductive material overlying the isolation region to shunt the first region with the second region.

In various embodiments, the isolation region may comprise a trench filled, at least in part, with an insulating material. In various embodiments, the insulating material comprises a material having an index of refraction smaller than an index of refraction of silicon. In various embodiments, the insulating material comprises silicon oxide, silicon nitride, or air. In various embodiments, the conductive material is disposed, at least in part, within the trench.

In various embodiments, the isolation region comprises a first isolation region located on a first side of the photo-active region, and wherein the device further comprises a second isolation region in the substrate and located on a second side of the photo-active region such that the photo-active region is located between the first isolation region and the second isolation region.

In various embodiments, the conductive material comprises doped poly-silicon.

In various embodiments, the substrate forms, at least in part, a waveguide. In various embodiments, the photonic device further comprises a mirror configured to reflect light from the waveguide toward the photo-active region. In various embodiments, the mirror is configured to reflect light from the waveguide into a direction normal to a surface of the device substrate. In various embodiments, the mirror includes an angled facet. In various embodiments, the angled facet has an angle in a range of 30°-54.7° to a direction normal to a surface of the device substrate. In various embodiments, the device substrate comprises a handle substrate, an insulating layer on the handle substrate, and a silicon layer on the insulating layer, wherein the mirror comprises a trapezoid-shaped area having a bottom side defined by the handle substrate, opposite vertical sides defined by the insulating layer, and inwardly angled facets defined by the silicon layer. In various embodiments, the device further comprises oxide or a polymer filling the trapezoid-shaped area.

In various embodiments, the photo-active region comprises germanium or silicon germanium.

In various embodiments, the substrate comprises a silicon-on-insulator substrate.

All optional features of the photonic devices described above may also be implemented with respect to a method or process described herein. For example, in various embodiments, a method for forming a photonic device may comprise forming an isolation region in a device substrate, forming a conductive material over the isolation region for shunting a first region of the device substrate with a second region of the device substrate, forming a photo-active region on the first region of the device substrate, and forming a contact on the second region of the device substrate such that the isolation region is located between the contact and the photo-active region.

In various embodiments, the isolation region comprises a first isolation region located on a first side of the photo-active region, and the method further comprises forming a second isolation region in the substrate on a second side of the photo-active region such that the photo-active region is located between the first isolation region and the second isolation region.

In various embodiments, the method comprises forming a mirror configured to reflect light from the waveguide toward the photo-active region. In various embodiments, the device substrate comprises a handle substrate, an insulating layer on the handle substrate, and a silicon layer on the insulating layer, and the forming the mirror comprises forming a trapezoid-shaped area in the device substrate, the trapezoid-shaped area having a bottom side defined by the handle substrate, opposite vertical sides defined by the insulating layer, and inwardly angled facets defined by the silicon layer. In various embodiments, the method further comprises filling the trapezoid-shaped area with oxide or a polymer.

In various embodiments, forming the photo-active region comprises forming a germanium photodetector on the first region of the device substrate.

All optional features of the apparatus described above may also be implemented in various apparatuses and various systems. For example, in various embodiments, a system may comprise an embodiment of the photonic device described above and one or more processors operatively coupled with the photonic device. In various embodiments, the system may comprise a display device operatively coupled to the photonic device and the one or more processors. In various embodiments, the display device may be a touch screen.

In various embodiments, the system may be a selected one of a laptop, a netbook, a notebook, an ultrabook, a smartphone, a tablet, a personal digital assistant, an ultra mobile PC, a mobile phone, a desktop computer, a server, a printer, a scanner, a monitor, a set-top box, an entertainment control unit, a digital camera, a portable music player, or a digital video reorder.

In various embodiments, the system comprises one or more antennae configured to establish a wireless communication link between the system and one or more components of a wireless network.

Although various example methods, apparatuses, and systems have been described herein, the scope of coverage of the present disclosure is not limited thereto. On the contrary, the present disclosure covers all methods, apparatus, and articles of manufacture fairly falling within the scope of the appended claims, which are to be construed in accordance with established doctrines of claim interpretation. For example, although the above discloses example systems including, among other components, software or firmware executed on hardware, it should be noted that such systems are merely illustrative and should not be considered as limiting. In particular, it is contemplated that any or all of the disclosed hardware, software, and/or firmware components could be embodied exclusively in hardware, exclusively in software, exclusively in firmware or in some combination of hardware, software, and/or firmware.

What is claimed is:

1. A photonic device comprising:
   a device substrate;
   a photo-active region disposed on a first region of the device substrate;
   an isolation region in the device substrate;
   a contact disposed on a second region of the substrate such that the isolation region is located between the contact and the photo-active region; and
   a conductive material overlying the isolation region to shunt the first region with the second region.

2. The device of claim 1, wherein the isolation region comprises a trench filled, at least in part, with an insulating material, wherein the insulating material comprises a material having an index of refraction smaller than an index of refraction of silicon.

3. The device of claim 2, wherein the insulating material comprises silicon oxide, silicon nitride, or air.

4. The device of claim 2, wherein the conductive material is disposed, at least in part, within the trench.

5. The device of claim 1, wherein the isolation region comprises a first isolation region located on a first side of the photo-active region, and wherein the device further comprises a second isolation region in the substrate and located on a second side of the photo-active region such that the photo-active region is located between the first isolation region and the second isolation region.

6. The device of claim 1, wherein the conductive material comprises doped poly-silicon.

7. The device of claim 1, wherein the substrate forms, at least in part, a waveguide.

8. The device of claim 7, further comprising a mirror configured to reflect light from the waveguide toward the photo-active region.

9. The device of claim 8, wherein the mirror is configured to reflect light from the waveguide into a direction normal to a surface of the device substrate.

10. The device of claim 8, wherein the mirror includes an angled facet, wherein the angled facet has an angle in a range of 30°-54.7° to a direction normal to a surface of the device substrate.

11. The device of claim 8, wherein the device substrate comprises a handle substrate, an insulating layer on the handle substrate, and a silicon layer on the insulating layer, wherein the mirror comprises a trapezoid-shaped area having a bottom side defined by the handle substrate, opposite vertical sides defined by the insulating layer, and inwardly angled facets defined by the silicon layer.

12. The device of claim 11, wherein the device further comprises oxide or a polymer filling the trapezoid-shaped area.

13. The device of claim 1, wherein the photo-active region comprises germanium or silicon germanium.

14. The device of claim 1, wherein the substrate comprises a silicon-on-insulator substrate.

15. A method for forming a photonic device, comprising:
    forming an isolation region in a device substrate;
    forming a conductive material over the isolation region for shunting a first region of the device substrate with a second region of the device substrate;
    forming a photo-active region on the first region of the device substrate; and
    forming a contact on the second region of the device substrate such that the isolation region is located between the contact and the photo-active region.

16. The method of claim 15, wherein the isolation region comprises a trench filled, at least in part, with an insulating material, and wherein the insulating material comprises silicon oxide or silicon nitride.

17. The method of claim 15, wherein the isolation region comprises a first isolation region located on a first side of the photo-active region, and wherein the method further comprises forming a second isolation region in the substrate on a second side of the photo-active region such that the photo-active region is located between the first isolation region and the second isolation region.

18. The method of claim 15, further comprising forming a mirror configured to reflect light from the waveguide toward the photo-active region.

19. The method of claim 18, wherein the device substrate comprises a handle substrate, an insulating layer on the handle substrate, and a silicon layer on the insulating layer, and wherein said forming the mirror comprises forming a trapezoid-shaped area in the device substrate, the trapezoid-shaped area having a bottom side defined by the handle substrate, opposite vertical sides defined by the insulating layer, and inwardly angled facets defined by the silicon layer.

20. The method of claim 19, further comprising filling the trapezoid-shaped area with oxide or a polymer.

21. The method of claim 15, wherein said forming the photo-active region comprises forming a germanium photo-detector on the first region of the device substrate.

22. A system comprising:
a photonic device comprising:
a device substrate;
a photo-active region disposed on a first region of the device substrate;
an isolation region in the device substrate;
a contact disposed on a second region of the substrate such that the isolation region is located between the contact and the photo-active region; and
a conductive material overlying the isolation region to shunt the first region with the second region;
one or more processors operatively coupled with the photonic device; and
a display device operatively coupled to the photonic device and the one or more processors.

23. The system of claim 22, wherein the system is a selected one of a laptop, a netbook, a notebook, an ultrabook, a smartphone, a tablet, a personal digital assistant, an ultra mobile PC, a mobile phone, a desktop computer, a server, a printer, a scanner, a monitor, a set-top box, an entertainment control unit, a digital camera, a portable music player, or a digital video reorder.

24. The system of claim 22, further comprising one or more antennae configured to establish a wireless communication link between the system and one or more components of a wireless network.

25. The system of claim 22, wherein the display device is a touch screen.

* * * * *

UNITED STATES PATENT AND TRADEMARK OFFICE
CERTIFICATE OF CORRECTION

PATENT NO. : 8,866,247 B2  
APPLICATION NO. : 13/977390  
DATED : October 21, 2014  
INVENTOR(S) : Avi Feshali et al.

It is certified that error appears in the above-identified patent and that said Letters Patent is hereby corrected as shown below:

In the specification,

Column 1 – AFTER LINE 14 and BEFORE LINE 15 insert:
--GOVERNMENT INTEREST STATEMENT
This invention was made with Government support under contract number H98230-08-3-0011 awarded by the Department of Defense. The Government has certain rights in this invention.--

Signed and Sealed this  
Tenth Day of November, 2015

Michelle K. Lee  
*Director of the United States Patent and Trademark Office*